(12) United States Patent
Lin

(10) Patent No.: US 6,319,751 B1
(45) Date of Patent: *Nov. 20, 2001

(54) BUMPLESS FLIP CHIP ASSEMBLY WITH SOLDER VIA

(76) Inventor: Charles Wen Chyang Lin, 55 Cairnhill Road, #21-04 Cairnhill Plaza, Singapore 229666 (SG)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/465,024

(22) Filed: Dec. 16, 1999

(30) Foreign Application Priority Data

Dec. 17, 1998 (SG) .................................. 9804817

(51) Int. Cl.$^7$ .................................................. H01L 21/48
(52) U.S. Cl. ........................................... 438/108; 438/667
(58) Field of Search .................................. 257/778, 779, 257/772, 774; 438/108, 667, FOR 348, FOR 363

(56) References Cited

U.S. PATENT DOCUMENTS

| | | | |
|---|---|---|---|
| 4,984,358 | * | 1/1991 | Nelson . |
| 5,261,593 | | 11/1993 | Casson et al. ............... 228/180.22 |
| 5,397,921 | | 3/1995 | Karnezos ....................... 257/779 |
| 5,487,218 | * | 1/1996 | Bhatt et al. ..................... 29/852 |
| 5,489,804 | * | 2/1996 | Pasch . |
| 5,583,073 | | 12/1996 | Lin et al. ....................... 439/183 |
| 5,736,456 | * | 4/1998 | Akram ............................ 438/614 |
| 5,803,340 | * | 9/1998 | Yeh et al. ...................... 228/56.3 |
| 5,861,666 | * | 1/1999 | Bellaar .......................... 257/686 |
| 6,013,877 | * | 1/2000 | Degani et al. .................. 174/264 |
| 6,020,561 | * | 2/2000 | Ishida et al. ................... 174/261 |
| 6,037,665 | | 3/2000 | Miyazaki et al. ............... 257/773 |
| 6,046,909 | * | 4/2000 | Joy . |
| 6,084,781 | * | 7/2000 | Klein . |
| 6,127,204 | * | 10/2000 | Isaacs et al. . |
| 6,184,589 | * | 2/2001 | Budnaitis et al. . |
| 6,265,782 | * | 7/2001 | Yamamoto et al. . |

* cited by examiner

*Primary Examiner*—George Fourson
*Assistant Examiner*—Michelle Estrada
(74) *Attorney, Agent, or Firm*—David M. Sigmond

(57) ABSTRACT

A flip chip assembly, and methods of forming the same, including a single or multilayer substrate having a plurality of via holes which serve as the connection between the semiconductor device and substrate circuitry. The method of manufacturing the flip chip assembly includes attaching an integrated circuit (IC) chip having a plurality of input/output terminal pads to a rigid or flexible substrate having a plurality of via holes. The via holes are aligned with the terminal pads so that the respective traces on the substrate can be connected to the respective terminal pads through the via holes. After attachment, the pre-deposited solder inside the via holes or on the terminal pads is re-flowed. This re-flow soldering process electrically connects the IC chip to the substrate. The soldering can be deposited by plating, wave soldering, meniscus coating, and screen printing techniques.

68 Claims, 4 Drawing Sheets

BUMPLESS FLIP CHIP ASSEMBLY WITH SOLDER VIA

The present application is an application filed in accordance with 35 U.S.C. §119 and claims the benefit of earlier filed Singapore application number 9804817-6 filed on Dec. 17, 1998.

1. Field of the Invention

This invention relates generally to a semiconductor device assembly, and in particular, relates to connection of integrated circuit (IC) chip or chips to a substrate circuitry, printed circuit board, and interconnect components.

2. Background of the Invention

Recent developments of semiconductor packaging suggest an increasingly critical role of the technology. New demands are coming from requirements for more leads per chip and hence smaller input/output terminal pad pitch, shrinking die and package footprints, and higher operational frequencies that generate more heat, thus requiring advanced heat dissipation designs. All of these considerations must be met and, as usual, placed in addition to the cost that packaging adds to the overall semiconductor manufacturing costs.

Conventionally, there are three predominant chip-level connection technologies in use for integrated circuits, namely wire bonding, tape automated bonding (TAB) and flip chip (FC) to electrically or mechanically connect integrated circuits to leadframe or substrate circuitry. Wire bonding has been the far most broadly applied technique in the semiconductor industry because of its maturity and cost effectiveness. However, this process can be performed only one wire bond at a time between the semiconductor chip's bonding pads and the appropriate interconnect points. Furthermore, because of the ever increasing operational frequency of the device, the length of the interconnects needs to be shorter to minimize inductive noise in power and ground, and also to minimize crosstalk between the signal leads. An example of such a method is disclosed in U.S. Pat. No. 5,397,921 issued to Karnezos et al.

Flip chip technology is characterized by mounting of the unpackaged semiconductor chip with the active side facing down to an interconnect substrate through contact anchors such as solder, gold or organic conductive adhesive bumps. The major advantage of flip chip technology is the short interconnects which can, therefore, handle high speed or high frequency signals. There are essentially no parasitic elements, such as inductance. Not only is the signal propagation delay slashed, but much of the waveform distortion is also eliminated. Flip chip also allows an array interconnecting layout that provides more I/O than a perimeter interconnect with the same die size. Furthermore, it requires minimal mounting area and weight which results in to overall cost saving since no extra packaging and less circuit board space is used. An example of such a method is disclosed in U.S. Pat. No. 5,261,593 issued to Casson et al.

While flip chip technology has tremendous advantages over wire bonding, its cost and technical limitations are significant. First of all, prior art flip chip technology must confront the challenge of having to form protruded contact anchors or bumps to serve as electrical connections between the integrated circuit chip and substrate circuitry. Examples of such an approach are disclosed in U.S. Pat. No. 5,803,340 issued to Yeh et. al. and U.S. Pat. No. 5,736,456 issued to Akram. These approaches typically include a very costly vacuum process to deposit an intermediate under-bump layer that serves as an adhesive and diffusion barrier. This barrier layer is typically composed of a film stack that can be in the structure of chromium/copper/gold. Bumping materials such as solder are subsequently deposited onto this intermediate layer through evaporation, sputtering, electroplating, solder jetting or paste printing methods followed by a reflow step to form the solder contacts. Although evaporation and sputtering can potentially offer high density bumps, these processes need very tight control and normally result in poor yield. As a result, a conventional flip chip assembly is not only very costly but also suffers from very serious reliability problems and a high fatality ratio.

Techniques for fabricating the intermediate under-bump barrier layer as well as the bump material utilizing electroless plating are also known in the prior art. An example of such a method is described in the U.S. Pat. No. 5,583,073 issued to Lin et al. Although the electroless technique provides an economical, simple and effective method for providing an under-bump barrier layer, contacting material such as solder or adhesive is still required for assembling. Solder dipping or screen printing of solder paste onto these bumps has been explored but has been met with very limited success due to lack of solder bridging control and non-uniform deposition of solder on the metal bumps. This process also suffers from poor process control as input/output terminal pad spacing gets smaller.

In view of the limitations of currently available integrated circuit assembling methods, a high performance, reliable and economical device and method that can effectively interconnect integrated circuits to the external circuitry would be greatly desirable.

SUMMARY OF THE INVENTION

It is therefore, an object of the present invention to provide a flip chip assembly to address high density, low cost and high performance requirements of semiconductor packaging. The device and method of the present invention involve the bonding of substrate circuitry to a semiconductor device through the reflowing of pre-deposited solder to connect via apertures or holes of the substrate to terminal pads of the semiconductor device without the need for conventional bumps, bonding wire, or other media.

More specifically, the present invention relates to a chip assembly that includes a single or multi-layered substrate of which circuitry is connected to the input/output terminal pads of the IC chip through solder reflow in the via holes. The solder deposition techniques include electrolytic plating, electroless (chemical) plating, wave soldering, meniscus coating and solder printing.

In summary, using soldering material directly reflowed between a via hole and a terminal pad can effectively connect an IC chip and dielectric substrate circuitry without external bumps or wires. This approach allows a reliable, low profile, high performance and low cost assembly to be achieved. In particular, a small via hole formed by laser drilling or other techniques allows a very fine pitch terminal pad to be interconnected, which can significantly enhance the capability of packaging future high I/O semiconductor chips.

DETAILED DESCRIPTION OF THE INVENTION

Figure 1A:
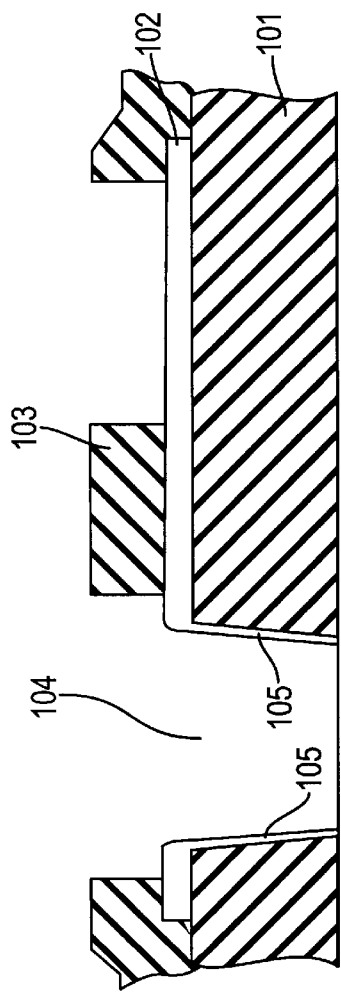
FIG. 1A is a fragmented partial sectional side elevational view of a substrate before plating the via hole with solder.

The bumpless flip chip assembly of the present invention includes a rigid or flexible dielectric substrate having a plurality of electrically conductive circuitry traces and a plurality of via apertures or holes. The conductive traces on the surface of the substrate extend into the via holes through the conductive material deposited on the via holes walls. This plated through-hole (PTH) material such as plated copper, gold, nickel, titanium, or palladium provides a conductive base for solder deposition or solder wetting. Soldering material such as tin-lead alloy or lead-free solder is pre-deposited in the via hole or on the terminal pad. This readily available solder serves as the joint material after the substrate is attached to the semiconductor chip. The orientation of the attachment between the chip and substrate circuitry ensures that at least one of the via holes in the dielectric substrate is aligned with a terminal pad.

After alignment, the IC chip is brought in contact with the dielectric substrate through an adhesive film or paste, or mechanical techniques such as mechanical clamping. This soft or proximity contact is to ensures that the pre-deposited soldering material is able to reflow into the via hole as well as onto the terminal pad when it is molten. Heat, which serves to activate the flux and bring the solder to its melting point, is used to effect the metallurgical bonding. This re-flow process results in a solder joint which electrically and physically connects the via hole and IC pad. This not only assures a very cost effective and simple process, but also provides a compliant joint with significant stress release which results in a very reliable connection between the substrate circuitry and IC chip.

As defined herein, the preferred embodiment is particularly directed to the bonding of an integrated circuit (IC) chip to a flexible circuitized substrate, or to a more rigid, circuitized substrate, a particular example of the latter being a printed circuit board. It is to be understood, however, that the invention is not limited to the attachment to printed circuit boards, in that other circuitized substrates, including known plastic and ceramic substrates, may be employed. Typically, an organic-type substrate is preferable for lower cost and superior dielectric property whereas an inorganic-type substrate is preferable when high thermal dissipation and matched coefficient of expansion are desired. The term "substrate" as used herein is defined as at least one layer of dielectric material having at least one conductive layer thereon. Printed circuit boards of similar type are well known in the electronics industry, as well as the processes for making the same, and therefore, further definition is not believed to be necessary. Such structures may include many more electrically conductive layers than those depicted in FIGS. 1A through 1E, depending on the desired operational characteristics. As is known, such electrically conductive layers may function as signal, power, and/or ground layers.

In one embodiment of the invention, the solder pre-deposition is in the via hole. In this embodiment, the via holes are first metallized with a base metal by a conventional plated through hole (PTH) technique followed by the solder deposition. Solder desposition techniques include electroplating, electroless plating, wave soldering, meniscus solder coating, solder paste printing and dispensing to accomplish the pre-coating of solder material onto the metallized hole wall. It is understood that the particular solder or solder paste and methods of dispensing depicted herein are not meant to limit the invention.

In another embodiment of the invention, the solder pre-deposition is on the IC terminal pad. In this method, a barrier layer over-coated on an aluminum pad before solder deposition is preferred. This is to provide a good solder wetting surface and protect the aluminum surface against leaching, oxidation or degradation resulting from heat and soldering contact. This coating can be accomplished by sputtering a stake of thin film or by wet chemical direct plating of electroless nickel and immersion gold. For copper terminal pads, the pre-treatment may not be necessary when the surface is free of oxide and contamination.

The via holes of the substrate can be formed by various techniques including mechanical drilling, punching, plasma etching or laser drilling. They are formed in the substrate before or after the circuitry patterning depending on the various fabrication processes. The via holes are formed at locations where that can be aligned with and expose input/output terminal pads of the semiconductor chip or chips that are subsequently mounted on the side of the substrate opposite the side where the electrical circuitry is formed.

A preferred application of heat to reflow pre-deposited solder is by a convection oven. Alternatively, the heat may be applied by a laser to effect solder reflow and bonding to the IC terminal pads which are in the vicinity of the via holes. Another example of such an approach is an infrared (IR) continuous belt reflow oven. Alternatively, hot nitrogen gas may be directed onto the solder members of the assembly. It is understood that the particular re-flow techniques depicted above are not meant to limit the invention, in that it is also possible to reflow the solder using a vapor phase reflow system.

If the finished product is, for instance, a ball grid array package, solder balls will normally be placed on the specific traces on the surface of the dielectric substrate. This finished package can be connected to a printed circuit board by reflowing the solder balls to form an attachment to the conductors of the printed circuit board.

FIGS. 1A to 1E are diagrammatic cross-sectional views showing steps involved in the manufacturing of an integrated circuit assembly by pre-depositing solder in the substrate via hole and re-flowing the solder to connect the terminal pad.

Referring initially to FIG. 1A, a substrate 101 having a plurality of electrically conductive circuitry traces 102 partially covered by the solder mask 103 is shown. The traces 102 on the substrate 101 extend into a plurality of via holes 104 by a thin layer of plated through-hole copper 105 deposited on the via hole walls.

Figure 1B:
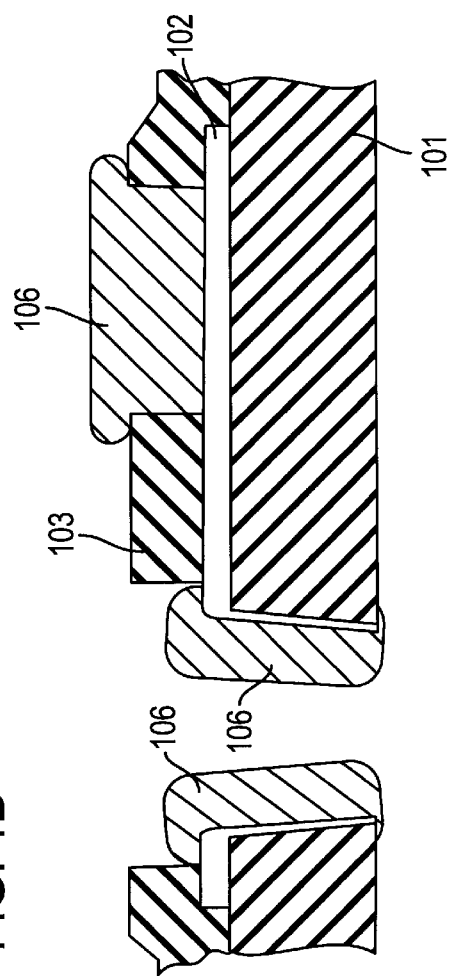
FIG. 1B is a fragmented partial sectional side elevational view of the substrate of the type shown in FIG. 1A after plating the via hole with solder.

FIG. 1B shows the substrate 101 immersed in a solder plating solution and a layer of solder 106 is electroplated on the metallized via hole wall as well as on the solder opening site.

Figure 1C:
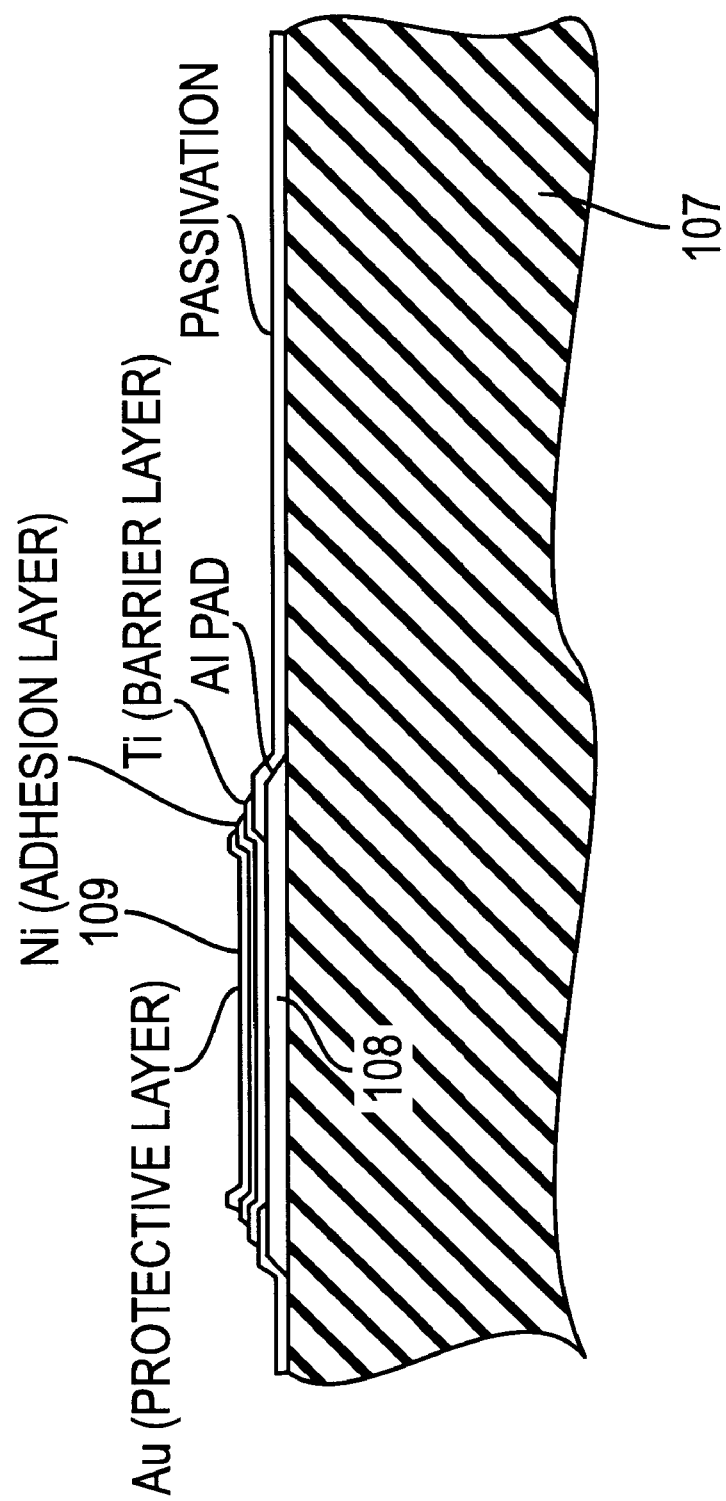
FIG. 1C is a fragmented partial sectional side elevational view of a semiconductor chip having a terminal pad.

FIG. 1C shows an integrated circuit chip 107 having various types of transistors, wires and the like (not shown), which has a plurality of exposed input/output terminal pads 108. These pads 108 are formed with a stake of thin film 109 in the structure of titanium (500 Angstroms)/nickel (700 Angstroms)/gold (1000 Angstroms) to serve as the barrier and adhesive layer. Passivation is disposed on chip 107 outside pads 108.

Figure 1D:
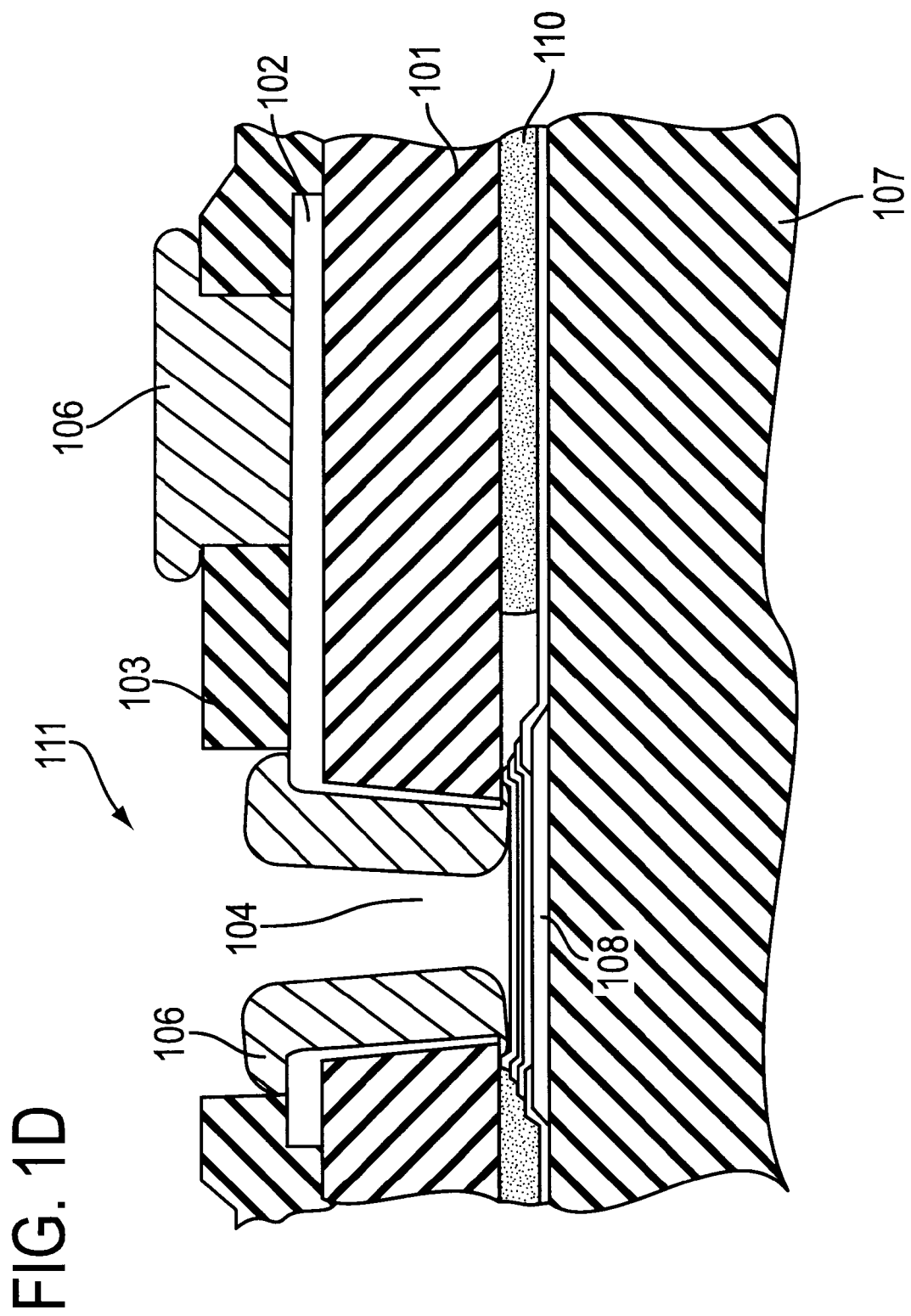
FIG. 1D is a fragmented partial sectional side elevational view of a chip assembly after a semiconductor chip of the type shown in FIG. 1C has been attached to a substrate of the type shown in FIG. 1B.

FIG. 1D shows IC chip 107 securely attached to the substrate 101 by adhesive paste ABLESTIK "ABLEBOND 961-2" 110 to form an assembly 111. The orientation of the attachment is arranged in such a manner that a specific terminal pad 108 of the integrated circuit chip 107 is in contact with the solder 106 inside a specific via hole 104. The via hole 104 serves as an electrically connecting channel for the respective trace 102 of the substrate 101.

Figure 1E:
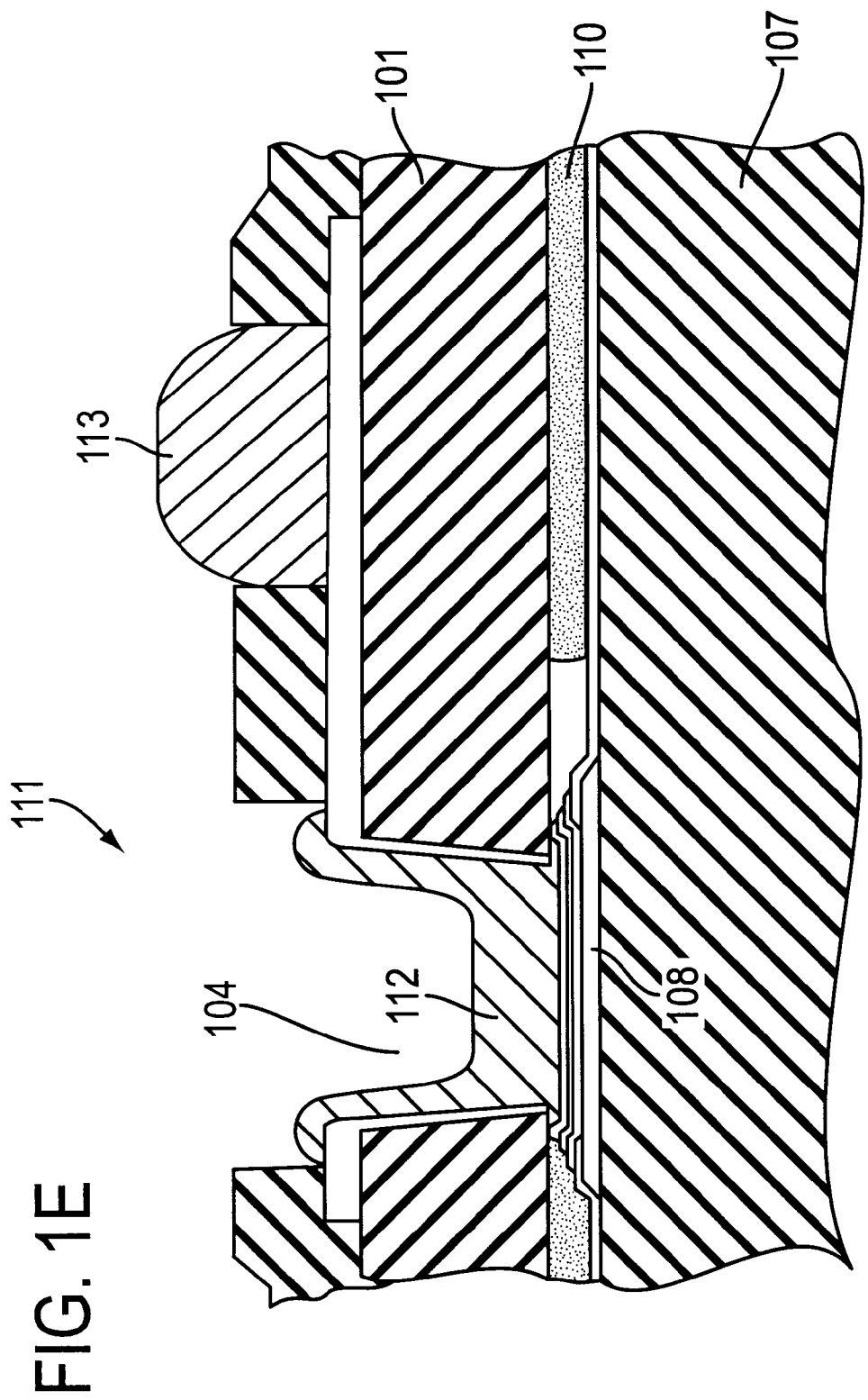
FIG. 1E is a fragmented partial sectional side elevational view of the chip assembly of the type shown in FIG. 1D after a solder reflow process.

FIG. 1E shows the input/output terminal pad 108 firmly joined together with a specific via hole 104 by solder joint 112 to become an integral part after the assembly 111 is placed in an oven that causes solder 106 to reflow. This simultaneously-reflowed joint 112 provides an effective electrical and mechanical connection between IC chip 107 and substrate 101. The soldering material 113 deposited in the solder mask opening serves as the contacting material for the next level assembly.

Though only one integrated circuit chip 107, it is to be understood that additional integrated circuit chips, as well as passive components such as resistors or capacitors, can also be mounted on the substrate 101.

Likewise, it is to be understood that many solder systems including lead-free ones, can also be applied and serve the connection purpose.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims and all changes which come within the meaning and range of equivalency of the claims are, therefore, to be embraced therein.

What is claimed is:

1. A bumpless method of assembling an integrated circuit device assembly, said integrated circuit device assembly including a substrate and an integrated circuit device, said substrate having a first surface, a second surface opposite to said first surface, and at least one via hole that extends between said first and second surfaces, said via hole having metallized walls, said integrated circuit device having at least one exposed terminal pad, said method comprising:

depositing a layer of reflowable material on said metallized walls of said via hole;

attaching said substrate to said integrated circuit device with said first surface opposite to said integrated circuit device and said via hole over said electrical terminal pad such that said reflowable material contacts said electrical terminal pad and said via hole exposes said electrical terminal pad at said first surface; and then reflowing said reflowable material, said reflowable material after being reflowed providing a permanent electrical and mechanical joint between said electrical terminal pad and said metallized walls of said via hole.

2. The method as recited in claim 1, wherein said substrate is attached to said integrated circuit device using an adhesive.

3. The method as recited in claim 1, wherein said electrical terminal pad includes a thin metal film.

4. The method as recited in claim 2, wherein said electrical terminal pad includes a thin metal film.

5. The method as recited in claim 2, wherein said adhesive is an adhesive paste.

6. The method as recited in claim 3, wherein said thin metal film comprises titanium, nickel, and gold.

7. The method as recited in claim 4, wherein said thin metal film comprises titanium, nickel, and gold.

8. The method as recited in claim 1, wherein said substrate is plastic.

9. The method as recited in claim 1, wherein said substrate is a flexible film.

10. The method as recited in claim 1, wherein said substrate is ceramic.

11. The method as recited in claim 1, wherein said reflowable material is solder.

12. The method as recited in claim 1, wherein said reflowable material is deposited on said metallized walls by electrolytic plating.

13. The method as recited in claim 1, wherein said reflowable material is deposited on said metallized walls by meniscus coating.

14. The method as recited in claim 1, wherein said reflowable material is deposited on said metallized walls by wave soldering.

15. The method as recited in claim 1, wherein said reflowable material is deposited on said metallized walls by solder paste printing.

16. The method as recited in claim 1, wherein said substrate is attached to said integrated circuit by mechanical clamping.

17. The method as recited in claim 1, wherein said reflowing of said reflowable material is achieved using a convection oven.

18. The method as recited in claim 1, wherein said reflowing of said reflowable material is achieved using a laser.

19. The method as recited in claim 1, wherein said reflowing of said reflowable material is achieved using a continuous belt reflow oven.

20. The method as recited in claim 11, wherein said reflowing of said reflowable material is achieved using a convection oven.

21. The method as recited in claim 11, wherein said reflowing of said reflowable material is achieved using a laser.

22. The method as recited in claim 11, wherein said reflowing of said reflowable material is achieved using a continuous belt reflow oven.

23. A method of making a flip chip assembly, comprising:

attaching a substrate to a semiconductor chip, wherein the substrate includes first and second surfaces that are opposite one another and a via hole that extends between the first and second surfaces, the via hole includes metallization on its walls, the chip includes a terminal pad that is aligned with the via hole, and a reflowable material contacts the metallization and the pad without filling the via hole; and then reflowing the reflowable material to provide an electrical connection between the metallization and the pad.

24. The method as recited in claim 23, wherein the reflowable material is deposited on the metallization before attaching the substrate to the chip, and during the reflowing the reflowable material wets and flows on an exposed portion of the pad beneath the via hole.

25. The method as recited in claim 23, wherein the reflowable material is deposited on the pad before attaching the substrate to the chip, and during the reflowing the reflowable material wets and flows on an exposed portion of the metallization in the via hole.

26. The method as recited in claim 23, wherein the pad is directly beneath substantially all surface area defined by the via hole after the attaching.

27. The method as recited in claim 23, wherein the reflowable material fills a bottom portion of the via hole without filling a top portion of the via hole after the reflowing.

28. The method as recited in claim 23, wherein substantially all of the reflowable material is within the via hole after the reflowing.

29. The method as recited in claim 23, wherein the metallization and the reflowable material are the only materials in the via hole after the reflowing.

30. The method as recited in claim 23, wherein the reflowable material is solder.

31. The method as recited in claim 23, wherein the metallization is electrolessly plated on the walls of the via hole.

32. The method as recited in claim 23, wherein the substrate remains at a fixed position relative to the chip during the reflowing.

33. A method of making a flip chip assembly, comprising the following steps in the sequence set forth:

providing a substrate with first and second surfaces that are opposite one another and a via hole that extends between the first and second surfaces;

depositing metallization on walls of the via hole;

depositing solder on the metallization such that the solder is disposed in the via hole without filling the via hole;

attaching the substrate to a semiconductor chip that includes a terminal pad, wherein the first surface is opposite the chip, the via hole exposes the pad and the solder contacts the pad; and applying heat to reflow the solder to form a solder joint that contacts and electrically connects the metallization and the pad and prevents the via hole from exposing the pad.

34. The method as recited in claim 33, including depositing the metallization on the walls using electroless plating.

35. The method as recited in claim 33, including depositing the solder on the metallization using electroplating.

36. The method as recited in claim 33, including depositing the solder on the metallization using electroless plating.

37. The method as recited in claim 33, including depositing the solder on the metallization using wave soldering.

38. The method as recited in claim 33, including depositing the solder on the metallization using meniscus coating.

39. The method as recited in claim 33, including depositing the solder on the metallization using solder paste printing.

40. The method as recited in claim 33, including attaching the substrate to the chip using an adhesive between the substrate and the chip.

41. The method as recited in claim 33, including attaching the substrate to the chip using a mechanical clamp.

42. The method as recited in claim 33, including applying the heat to reflow the solder using a convection oven.

43. The method as recited in claim 33, including applying the heat to reflow the solder using a laser.

44. The method as recited in claim 33, including applying the heat to reflow the solder using an infrared continuous belt reflow oven.

45. The method as recited in claim 33, including applying the heat to reflow the solder using hot nitrogen gas.

46. The method as recited in claim 33, including applying the heat to reflow the solder using a vapor phase reflow system.

47. The method as recited in claim 33, wherein the pad is directly beneath substantially all surface area defined by the via hole after attaching the substrate to the chip.

48. The method as recited in claim 33, wherein the solder joint fills a bottom portion of the via hole without filling a top portion of the via hole.

49. The method as recited in claim 33, wherein the solder joint has a bowl-like shape.

50. The method as recited in claim 33, wherein substantially all of the solder joint is within the via hole.

51. The method as recited in claim 33, wherein the metallization and the solder joint are the only said materials in the via hole after applying the heat.

52. The method as recited in claim 33, wherein the substrate is at a fixed position relative to the chip during applying the heat.

53. A method of making a flip chip assembly, comprising the following steps in the sequence set forth:

providing a semiconductor chip that includes a terminal pad;

depositing solder on the pad;

attaching a substrate to the chip, wherein the substrate includes first and second surfaces that are opposite one another and a via hole that extends between the first and second surfaces, the via hole includes metallization on its walls, the via hole is aligned with the pad and exposes the solder, the solder contacts the metallization without filling the via hole, the first surface is opposite the chip, and the substrate is at a fixed position relative to the chip; and applying heat to reflow the solder such that the solder wets and flows on the metallization in the via hole and forms a solder joint that contacts and electrically connects the metallization and the pad while the substrate remains at the fixed position relative to the chip.

54. A method of making a flip chip assembly, comprising the following steps in the sequence set forth:

providing a substrate with first and second surfaces that are opposite one another and a via hole that extends between the first and second surfaces;

electrolessly plating metallization on walls of the via hole;

electroplating solder on the metallization such that the solder is disposed in the via hole without filling the via hole;

attaching the substrate to a semiconductor chip using an adhesive therebetween, wherein the first surface is opposite the chip, the chip includes a bumpless terminal pad, the via hole exposes the pad and the solder contacts the pad; and applying heat to reflow the solder such that the solder wets and flows on the pad and forms a solder joint that contacts and electrically connects the metallization and the pad and prevents the via hole from exposing the pad.

55. The method as recited in claim 54, wherein essentially all of the solder joint is in the via hole, and the solder joint has a bowl-like shape that fills a bottom portion of the via hole without filling a top portion of the via hole.

56. The method as recited in claim 54, wherein the metallization and the solder joint are the only materials in the via hole after applying the heat.

57. The method as recited in claim 54, wherein the pad is directly beneath essentially all surface area defined by the via hole after attaching the substrate to the chip.

58. The method as recited in claim 54, wherein attaching the substrate to the chip positions the substrate at a fixed position relative to the chip, and the substrate remains at the fixed position relative to the chip during applying the heat.

59. A method of making a flip chip assembly, comprising the following steps in the sequence set forth:

providing a substrate with first and second surfaces that are opposite one another, wherein the substrate includes a via hole and a conductive trace, the via hole extends between the first and second surfaces, and the conductive trace includes metallization on walls of the via hole and a bond site outside the via hole;

depositing solder on the metallization and the bond site, wherein the solder on the metallization is in the via hole, the solder on the bond site is proximate to the first surface and outside the via hole, and the solder on the metallization does not contact the solder on the bond site;

attaching the substrate to a semiconductor chip, wherein the first surface is opposite the chip, the chip includes a terminal pad, the solder on the metallization contacts the pad, and the solder on the bond site does not contact the chip; and applying heat to reflow the solder such that the solder on the metallization forms a solder joint that contacts and electrically connects the metallization and the pad, the solder on the bond site forms a solder contact that does not contact the solder joint and does not contact the chip, and the conductive trace electrically connects the solder joint and the solder contact.

60. The method as recited in claim 59, including depositing the solder on the metallization and the bond site using electroplating.

61. The method as recited in claim 59, including depositing the solder on the metallization and the bond site using electroless plating.

62. The method as recited in claim 59, including depositing the solder on the metallization and the bond site using wave soldering.

63. The method as recited in claim 59, including depositing the solder on the metallization and the bond site using meniscus coating.

64. The method as recited in claim 59, including depositing the solder on the metallization and the bond site using solder paste printing.

65. The method as recited in claim 59, wherein essentially all of the solder joint is in the via hole, and the solder joint has a bowl-like shape that fills a bottom portion of the via hole without filling a top portion of the via hole.

66. The method as recited in claim 59, wherein the metallization and the solder joint are the only materials in the via hole after applying the heat.

67. The method as recited in claim 59, wherein the pad is directly beneath essentially all surface area defined by the via hole after attaching the substrate to the chip.

68. The method as recited in claim 59, wherein attaching the substrate to the chip positions the substrate at a fixed position relative to the chip, and the substrate remains at the fixed position relative to the chip during applying the heat.

* * * * *